United States Patent
Sakamoto

(10) Patent No.: US 6,674,147 B2
(45) Date of Patent: Jan. 6, 2004

(54) SEMICONDUCTOR DEVICE HAVING A BIPOLAR TRANSISTOR STRUCTURE

(75) Inventor: Kazuhisa Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 117 days.

(21) Appl. No.: 09/873,412

(22) Filed: Jun. 5, 2001

(65) Prior Publication Data

US 2002/0024114 A1 Feb. 28, 2002

(30) Foreign Application Priority Data

Jun. 5, 2000 (JP) ........................................ 2000-168063
Dec. 20, 2000 (JP) ........................................ 2000-387465

(51) Int. Cl.$^7$ ..................... H01L 27/082; H01L 27/102; H01L 29/70; H01L 31/11
(52) U.S. Cl. ........................ 257/560; 257/561; 257/562; 257/563; 257/565; 257/579
(58) Field of Search ........................ 257/577, 551–568, 257/575, 579

(56) References Cited

U.S. PATENT DOCUMENTS

| | | | |
|---|---|---|---|
| 4,727,408 A | * | 2/1988 | Hatakeyama ................ 357/52 |
| 5,331,194 A | * | 7/1994 | Ueno .......................... 257/498 |
| 5,744,854 A | * | 4/1998 | Okada et al. ................ 257/565 |
| 5,756,387 A | * | 5/1998 | Villa et al. ................... 438/328 |
| 5,821,148 A | * | 10/1998 | Leighton et al. ............. 438/390 |

* cited by examiner

Primary Examiner—Jerome Jackson
Assistant Examiner—Jesse A. Fenty
(74) Attorney, Agent, or Firm—Arent Fox Kintner Plotkin & Kahn, PLLC

(57) ABSTRACT

Formed on the surface of an n-type semiconductor layer (21) taken as a collector region is a base region (22) consisting of a p-type region, and formed in the p-type region is an emitter region (23) consisting of an n$^+$-type region. Further, provided in the base region is a base electrode connecting portion (24) consisting of an n$^+$-type region, and a base electrode (26) is connected to the surface of the base electrode connecting portion, and an emitter electrode (27) and a collector electrode (28) are provided and connected electrically to the emitter region and the collector region (21), respectively. As a result, a semiconductor device is obtained which has the transistor in which the reduction in power consumption with a high withstand voltage can be achieved, and the fast switching speed is possible and the large current is obtained. Further a voltage-drive type bipolar transistor such as a digital transistor is obtained which is small in load capacity while establishing a desired drive voltage.

8 Claims, 9 Drawing Sheets ically, the present invention relates to a semiconductor
SEMICONDUCTOR DEVICE HAVING A BIPOLAR TRANSISTOR STRUCTURE

FIELD OF THE INVENTION

The present invention relates to a semiconductor device having a bipolar transistor structure which has a fast switching speed and can reduce power consumption. More specifically, the present invention relates to a semiconductor device having a bipolar transistor which contains a Zener diode at its base, can be used as a digital transistor, or makes it possible to provide a fast switching with low power consumption, while providing a large current capability, with a structure of stripe emitters, multi-emitters or multi-bases.

BACKGROUND OF THE INVENTION

The principled structure of bipolar transistors heretofore used is the one shown in FIG. 13. That is, formed in the surface layer portion of an n-type semiconductor layer 11, is a p-type base region 12, within which an n-type emitter region 13 is formed. Joined to the base region 12 is a base electrode 16 through a contact region 15 consisting of $p^+$-type region, and joined to the emitter region 13 is an emitter electrode 17. A collector electrode 18 is provided on the back of an $n^+$-type semiconductor substrate 11a under the n-type semiconductor layer 11. Numeral 19 designates an insulation film.

A bipolar transistor Tr with this structure, when used as a switching circuit, for example, shown in FIG. 14 (a), is connected though a resistor $R_1$ to a power voltage $V_{CC}$, wherein when a signal is inputted into the base, a base current $I_B$ flows, and thus the transistor Tr is operated to cause a collector current $I_C$ to flow. When considering a backward withstand voltage of the transistor, a backward withstand voltage $BV_{CEO}$ between collector/emitter with the base opened should be larger than the power voltage $V_{CC}$, and a backward withstand voltage $BV_{CBO}$ between collector/base with the base opened has been known to generally have a relationship with the $BV_{CEO}$ of the following equation (1), because a somewhat current flows even with the base opened, and thus a current amplification factor $h_{FE}$ is effective. FIG. 14(b) is a circuit diagram of an example consisting of a digital transistor described later.

$$V_{CC} < BV_{CEO} = BV_{CBO}/(1+h_{FE})^{1/n} \quad (1)$$

For example, trying to use the backward withstand voltage $BV_{CEO}$ between collector/emitter at 24 V, a design must be made so that the backward withstand voltage $BV_{CBO}$ between collector/base exhibits 60 V. To make this backward withstand voltage BV between collector/base higher, it is necessary to make the impurity concentration of the semiconductor layer 11 lower with a structure shown in the above-mentioned FIG. 13, and make larger the thickness d of the n-type semiconductor layer 11 located on the lower side of the base region 12 so that a depletion layer is sufficiently widened. Making lower the impurity concentration of the n-type semiconductor layer 11 or making thicker the thickness d thereof causes the series resistance between emitter/collector to be increased. On the other hand, a voltage $V_{CE(sat)}$ between collector/emitter when the transistor is allowed to operate to reach a steady state becomes larger in proportion to the $BV_{CEO}$, that is the $BV_{CBO}$ as shown in the following equation (2), so that trying to make larger the backward withstand voltage $BV_{CBO}$ between collector/base causes also the $V_{CE(sat)}$ to become larger.

$$V_{CE(sat)} \propto BV_{CEO} = BV_{CBO}/(1+h_{FE})^{1/n} \quad (2)$$

On the other hand, the power consumption becomes a product of the voltage $V_{CE(sat)}$ between collector/emitter in a steady state by the collector current $I_C$, so that the power consumption becomes larger by that portion if the withstand voltage $BV_{CBO}$ between collector/base is made larger.

In transistors requiring a large current, since the collector current relates mainly to the area and peripheral length of the emitter, so that a transistor structure can be assumed in which the area and peripheral length of the emitter are made large and which has multi-emitters, multi-bases or stripe emitters reducing the current density, but such structure not so contribute to the improvement in switching speed or the reduction in power consumption.

Further, where a voltage-drive type transistor such as a digital transistor is configured using such a bipolar transistor, for example, as shown in FIG. 14(b), the voltage-drive type transistor is formed of a circuit in which when a predetermined voltage is applied through dividing resistances $R_1$, $R_2$ to the base B of a bipolar transistor Q, the transistor Q is turned on, while when a predetermined voltage is not obtained, the transistor Q is not turned on. However, the bias setting by such dividing resistances provides a problem in that the speed is delayed due to the load capacity of the resistances and the like. Also, even when connecting a Zener diode externally to the base of the transistor, a capacity develops due to connecting lead and the like, thereby causing speed to become lower.

As described above, a bipolar transistor of this type has a problem in that trying to improve the backward withstand voltage causes the operating voltage ($V_{CE(sat)}$) to be also raised, thereby making power consumption large.

Further, although, in the above-mentioned transistor structure, the connecting portion of the base region with the base electrode 16 is formed with the $p^+$-type contact region 15 in order to obtain an ohmic contact by increasing impurity concentration, a higher impurity concentration in the contact region 15 causes electrons of a few number carriers to be blocked by the $p/p^+$ junction between the base region 12 and the contact region 15, whereby at switching operation, an electron accumulation develops in the base region 12. This provides a problem in that the switching loss becomes large, thereby preventing a fast switching (in particular, making off time longer), and further increasing power consumption.

Voltage-drive type transistors such as digital transistors using conventional bipolar transistors have a problem in that bias setting is made by resistance dividing, so that the load capacity becomes large and thus the speed is lowered.

SUMMARY OF THE INVENTION

The present invention is made to solve such problem, and an object of the present invention is to provide a semiconductor device having a bipolar transistor which has a high withstand voltage and can reduce power consumption.

Another object of the present invention is to provide a semiconductor device having a transistor which can obtain the fast switching speed and the large current.

Still another object of the present invention is to provide a voltage-drive type bipolar transistor, such as a digital transistor, which has a small load capacity while setting (establishing) a disired drive voltage.

Yet another object of the present invention is to configure a circuit using a Zener diode and a transistor for protecting against overvoltage and the like, by a discrete package containing two normal elements.

A semiconductor device according to the present invention has a bipolar transistor structure including; a first conductivity type semiconductor layer taken as a collector region, a base region consisting of a second conductivity type region provided in said first conductivity type semiconductor layer, an emitter region consisting of a first conductivity type region provided in said base region, a base electrode connecting portion having a first conductivity type provided in said base region, a base electrode provided on the surface of said base electrode connecting portion, and an emitter electrode and a collector electrode provided and electrically connected to said emitter region and said collector region, respectively.

With this structure, the semiconductor region is formed which conductivity type is different from that of the base region, between the base electrode and the base region, so that as a semiconductor structure, the structure between collector/base and that between collector/emitter become substantially the same. And since a reverse bias p/n junction is formed between base electrode and base region, so that no base current flows with the base opened. Thus, the backward withstand voltage between collector/base with the base opened becomes substantially the same as the backward withstand voltage between collector/emitter with the base opened.

That is, without requiring to increase the backward withstand voltage between collector/base by a voltage based on the transistor current amplification factor, the impurity concentration of the first conductivity type semiconductor layer taken as a collector region can be adjusted so as to obtain the backward withstand voltage between collector/emitter. As a result, without requiring to increase the resistance of the first conductivity type semiconductor layer to a value larger than is required, the operating voltage is lowered, thereby reducing power consumption.

The emitter region may be formed in the form of a plurality of stripe shape regions, and the base electrode connecting portion is formed along the stripe shape regions in the base region between the plurality of stripe shape regions; or the base region may be formed so as to be exposed in a matrix form in said emitter region, and the base electrode connecting portion is formed in each of the base region exposed in a matrix form; or the emitter region may be formed so as to have a plurality of regions which are exposed in a matrix form in the base region, and the base electrode connecting portion is formed in the base region adjacent to each of the plurality of regions.

By these constructions, with a large current transistor structure, the switching speed can be increased while lowering power consumption. In this case, the emitter electrode connected to the emitter region and the base electrode connected to the base electrode connecting portion are formed in an alternately meshed comb-tooth form, whereby an increase in capacity due to connecting wiring and the like can be prevented.

The base electrode connecting portion is formed by the diffusion from a circular opening having a diameter two times or less than the diffusion depth, or from an elongated opening having a width two times or less than the diffusion depth and having circular arc ends taking the width as a diameter, whereby the base current per unit cell can be increased and thus a large current can be attained. Now, circular does not mean a complete circular, but means a shape in which a partial corner portion is not formed, and including of also a shape appearing like an ellipse. The elongated opening means including of those in which a plurality of elongated openings (portions) are overlapped, not limited to one portion.

A transistor according to the present invention comprises; a first conductivity type semiconductor layer taken as a collector region, a base region consisting of a second conductivity type region provided in the first conductivity type semiconductor layer, an emitter region consisting of a first conductivity type region provided in the base region, a base electrode connecting portion having a first conductivity type provided in the base region, a base electrode provided on the surface of the base electrode connecting portion, and an emitter electrode and a collector electrode provided and electrically connected to the emitter region and the collector region, respectively, wherein Zener diode is formed so as to be broken down at a desired voltage at the p/n junction between the base electrode connecting portion and the base rejoin, by adjusting the impurity concentration of the base electrode connecting portion, said Zener diode being incorporated in series with the base.

With this structure, the transistor does not operate until the breakdown voltage of the Zener diode is exceeded. Thus, a voltage-drive transistor such as a digital transistor which does not operate unless applying a voltage equal to or larger than a predetermined value by adjusting the breakdown voltage can be embodied at a fast drive without introducing an increased capacity due to resistance dividing and the like.

By comprising the first transistor with the Zener diode aforementioned, and a second transistor whose base is connected to the collector or emitter of the first transistor, or an MOS transistor whose gate is connected to the collector or emitter of the first transistor, wherein the first transistor and the second transistor or the MOS transistor are contained in a single package, overvoltage protective device having the Zener diode and two transistors can be formed with discrete high withstand voltage, while using an usual package containing two elements.

DETAILED DESCRIPTION

Figure 1A:
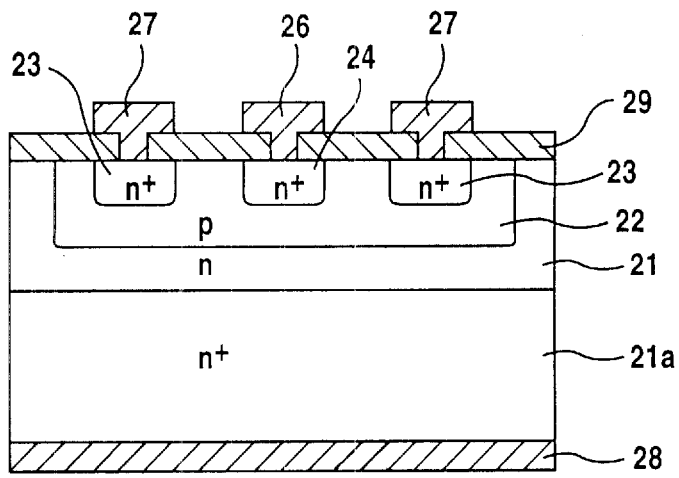
FIGS. 1(a) and 1(b) are views for explaining one embodiment of a semiconductor device having a bipolar transistor structure according to the present invention.

A semiconductor device according to the present invention is configured as shown in FIG. 1 as to a sectional explanatory view and a plan explanatory view of one embodiment thereof such that formed on the surface of a first conductivity type (n-type) semiconductor layer 21 taken as a collector region is a base region 22 consisting of a second conductivity type (p-type) region, and formed in the p-type region 22 is an emitter region 23 consisting of a first conductivity type ($n^+$-type) region. Further, provided in the base region 22 is a base electrode connecting portion 24 consisting of a first conductivity type ($n^+$-type) region, and a base electrode 26 is connected to the surface of the base electrode connecting portion 24. And an emitter electrode 27 and a collector electrode 28 are provided and connected electrically to the emitter region 23 and the collector region 21, respectively, whereby the semiconductor device has a bipolar transistor structure.

The collector electrode 28 is provided on the back of an $n^+$-type semiconductor substrate 21a on which the n-type semiconductor layer 21 is grown. Numeral 29 designates an insulation film of a material such as silicon oxide or silicon nitride.

That is, in a conventional transistor structure, formed in a base region is a contact region having the same conductivity type as that of the base region and high-concentration impurity, and formed on the contact region is a base electrode, while the present invention is characterized in that formed in the base region 22 is a different conductivity type base electrode connecting portion 24 from that of the base region, and connected to the different conductivity type base electrode connecting portion 24 is the base electrode 26.

Figure 1B:
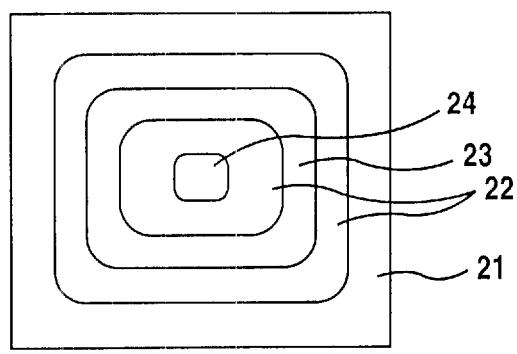

The base electrode connecting portion 24 may be formed at the same impurity concentration simultaneously with the emitter region 23, or may be introduced with an impurity in a process different from that for the emitter region 23 so that a required impurity concentration can be obtained in order to adjust the breakdown voltage of the Zener diode later described. Other structures other than those in which the base electrode connecting portion 24 is provided are similar to the conventional bipolar transistor structure. So the impurity concentration of the n-type semiconductor layer 21 taken as the base region 22 or the collector region is set by the backward withstand voltage for application purpose and the like. The example shown in FIG. 1, wherein a plane explanatory view of the semiconductor surface is illustrated in FIG. 1(b), is an example of a simple structure. In this structure, the ring-shaped $n^+$-type emitter region 23 is formed in the p-type base region 22, and the $n^+$-type base electrode connecting portion 24 is formed in the central portion, so that the base electrode 26 is formed.

A reason why the switching speed of the transistor with this structure becomes fast will be explained. Generally, when a transistor is turned off from the operating condition, if electrons of the minority carrier in the base region 22 (in case of FIG. 1) are immediately dissipated, the current will fail to flow, thereby causing the transistor to be immediately turned off, while if electrons of the minority carrier remain continuously, recombination will continue, thereby causing the transistor to be not completely turned off, and thus the switching time to become longer. However, in the transistor structure of the present invention, the region 24 connected to the base electrode 26 is the $n^+$-type region. So the electrons of the minority carrier having reached to the base electrode 26 side are not accumulated at the interface with the p-type region (base region) as conventional ones, and thus are immediately dropped in the $n^+$-type region 24 and dissipated. Therefore, the accumulation of electrons in the base region 22 is controlled, thereby allowing the switching to be performed at a higher speed and with a lesser loss.

Figure 2:
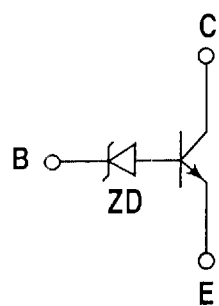
FIG. 2 is a diagram showing an equivalent circuit of the semiconductor device shown in FIG. 1.

According to the structure of the present invention, the base electrode connecting portion 24 which is the different conductivity type from the base region 22 is provided between the base region 22 and the base electrode 26, so that a reverse bias p/n junction is formed between the base and the base electrode, whereby this transistor operates similar to that in which a reverse direction Zener diode ZD is connected to the base terminal of the transistor in external, as the equivalent circuit is shown in FIG. 2.

The Zener diode ZD is connected in the reverse direction to the base of the transistor, so that the transistor is not turned on unless a voltage equal to or larger than a reverse direction breakdown voltage determined by the diode is applied. Therefore, the $BV_{CBO}$ may be sufficient to held the same withstand voltage as the backward withstand voltage $BV_{CEO}$ between collector/emitter with the base opened. That is, in a conventional transistor, a little leak current flows even with the base opened to cause the transistor to become on. And thus the current amplification factor $h_{FE}$ give an effect, so that a withstand voltage about three times the $BV_{CEO}$ between collector/emitter has been required by the above-mentioned equation (1). Thus, the impurity concentration of the n-type semiconductor layer 21 taken as the collector region can be increased and at the same time, a serial resistance value between collector/emitter can be decreased.

By the fact that the serial resistance value between collector/emitter can be decreased, the voltage $V_{CE(sat)}$ between collector/emitter in operating condition is decreased, whereby a power consumption which is the product of $V_{CE(sat)}$ by the corrector current $I_C$ can be reduced. On the other hand, the reverse-direction Zener diode is connected in series to the base, so that the transistor does not operate unless the voltage applied to the base electrode is equal to or larger than the breakdown voltage of the diode. However, a normal MOS-type semiconductor device is driven at about 5 V, so that, even when achieving IC (Integrated Circuit), there is no inconvenience with respect to the operation. The reverse-direction breakdown voltage can be set at a required value by adjusting the impurity concentration of the base electrode connecting portion 24, and thus, the voltage can be set at a required value between about 2 and 30 V.

As described above, according to the present invention, although the bipolar transistor with the fast switching speed and the lesser power consumption is obtained, it has the structure in which the reverse-direction Zener diode is connected in series to the base, as shown in FIG. 2, so that the transistor does not operate unless the voltage equal to or larger than the Zener voltage is applied. That is, utilizing such properties, a voltage-drive type transistor such as a digital transistor may also be made.

Figure 14A:
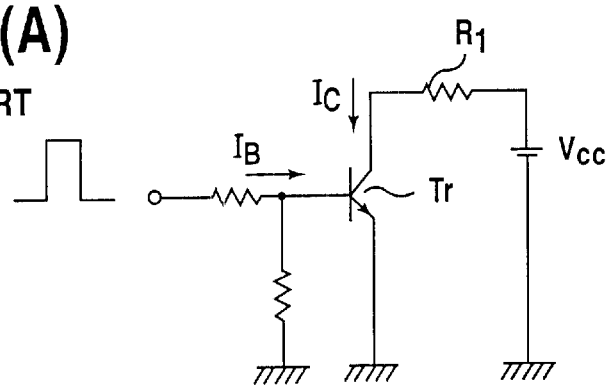
FIGS. 14(a) and 14(b) are diagrams showing a circuit example when a conventional bipolar transistor is used as a switching element, and a circuit example when used as a digital transistor, respectively.
Figure 14B:
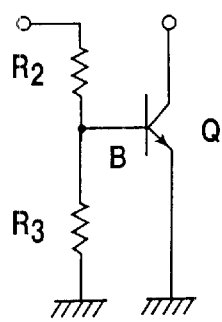

As described above, the conventional digital transistor, as shown in FIG. 14(b), is formed by a circuit in which when a predetermined voltage is applied through dividing resistances $R_1$, $R_2$ to the base, the transistor Q is turned on, while when a predetermined voltage is not reached, the transistor Q is not turned on, whereby a problem exists in that the speed is delayed. However, according to the present invention, the Zener diode is contained in the transistor, so that a load capacity and the like are not developed, and when a predetermined voltage is applied, the transistor is immediately allowed to be turned on, while when a predetermined voltage is not reached, the transistor is not allowed to be turned on. Further, the predetermined voltage can be freely set by only adjusting the breakdown voltage of the Zener diode, whereby the transistor can be formed in a very small one chip.

Figure 3:
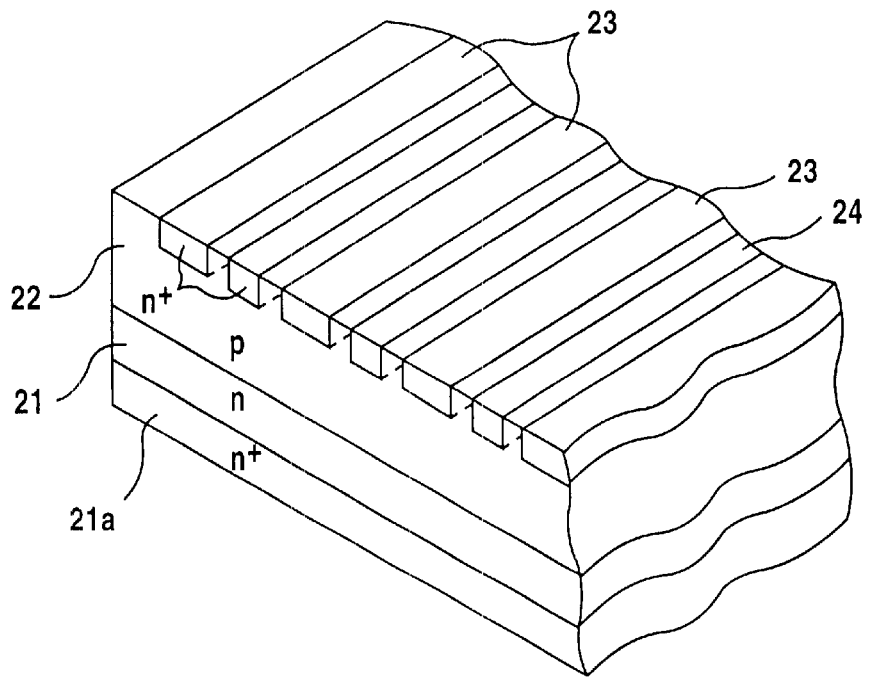
FIG. 3 is an explanatory view of an example in which the present invention is used for a semiconductor device having a stripe emitter structure.

FIG. 3 is a perspective explanatory view showing an example wherein the transistor of the present invention is a bipolar transistor with a stripe emitter structure. A plurality of long strip paper shaped $n^+$-type emitter regions (stripe shape regions) 23 extending in parallel are arranged and formed in the p-type base region 22. The base electrode connecting portions 24 having the $n^+$-type are formed in a stripe form in the base region 22 between the stripe shape emitter regions 23. Then, the emitter electrode and the base electrode (both are not shown) are provided in a stripe form on the stripe shape emitter regions 23 and the base electrode connecting portions 24. By the fact that such stripe emitter structure is formed, the contact area of the emitter region with the base region becomes large, whereby a large current is easy to be accommodated.

Further, in the present invention, $n^+$-type base electrode connecting portions 24 are formed in parallel to the stripe shape emitter regions 23, so that the minority carrier remaining in the base region at switching can be immediately dissipated, whereby the switching speed can be made faster and power consumption made small, because it is not required to lower the impurity concentration of the semiconductor layer 21 more than it needs.

Figure 4:
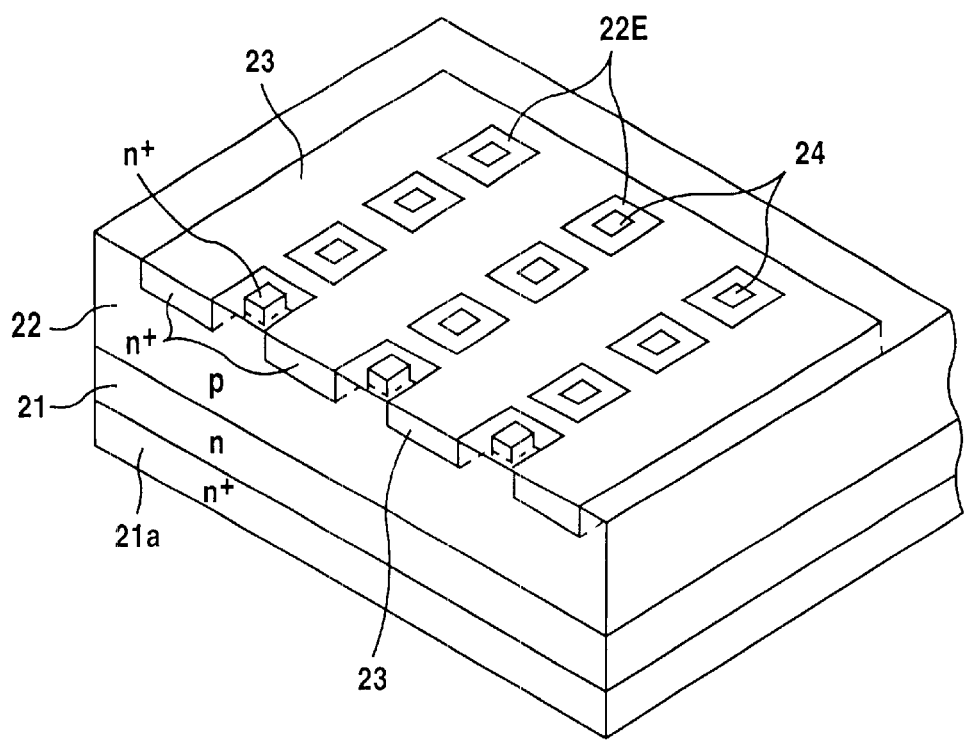
FIG. 4 is an explanatory view of an example in which the present invention is used for a semiconductor device having a multi-base structure.

FIG. 4 is an example of a multi-base structure, wherein the exposed portions 22E of the base region 22 are arranged and dotted in a matrix form, and in other region, $n^+$-type emitter region 23 is exposed on the surface of the semiconductor substrate. And, formed in the central portion of each of the exposed portions 22E of the base region 22 are $n^+$-type base electrode connecting portions 24. With also this structure, similarly to the above-mentioned stripe emitter structure, the contact area of the emitter region with the base region may be made large, and the large current is accommodated. On the other hand, the switching speed can be made fast, and at the same time, power consumption made small by the same reason as abovementioned.

Figure 5:
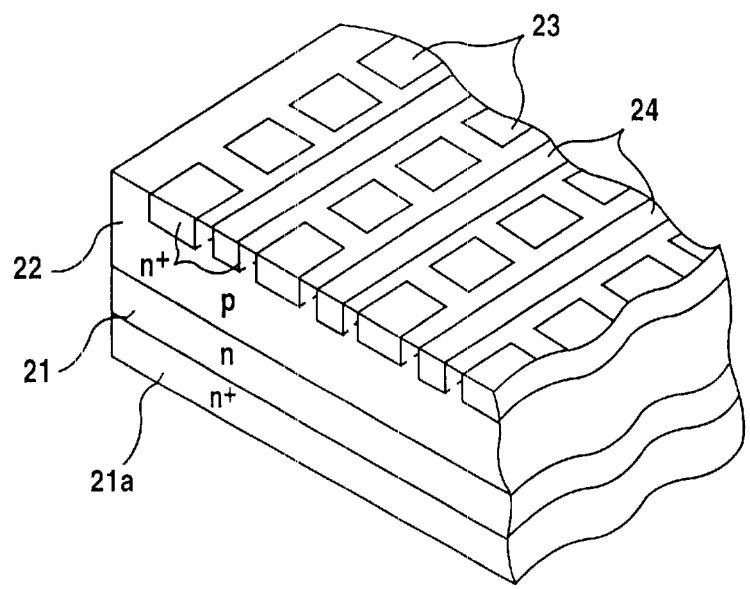
FIG. 5 is an explanatory view of an example in which the present invention is used for a semiconductor device having a multi-emitter structure.

FIG. 5 is an example of a multi-emitter structure, wherein a plurality of $n^+$-type emitter regions 23 are arranged and dotted in a matrix form, and in other region, the p-type base region 23 is exposed on the semiconductor substrate surface. And, $n^+$-type base electrode connecting portions 24 are formed in a stripe form in the base region 22 between the emitter regions 23. The base electrode connecting portions 24 may not be formed in a stripe form, but be formed only in the portion adjacent to the emitter regions 23, and connected with a base electrode (not shown). And further, the base electrode connecting portions 24 may be formed in the portions adjacent to the emitter regions 23 arranged vertically and horizontally.

With also this structure, similarly to the above-mentioned stripe emitter structure, the contact area of the emitter region with the base region may be made large, so that while accommodating for a large current, the switching speed can be made fast, and at the same time, power consumption made small.

Figure 6:
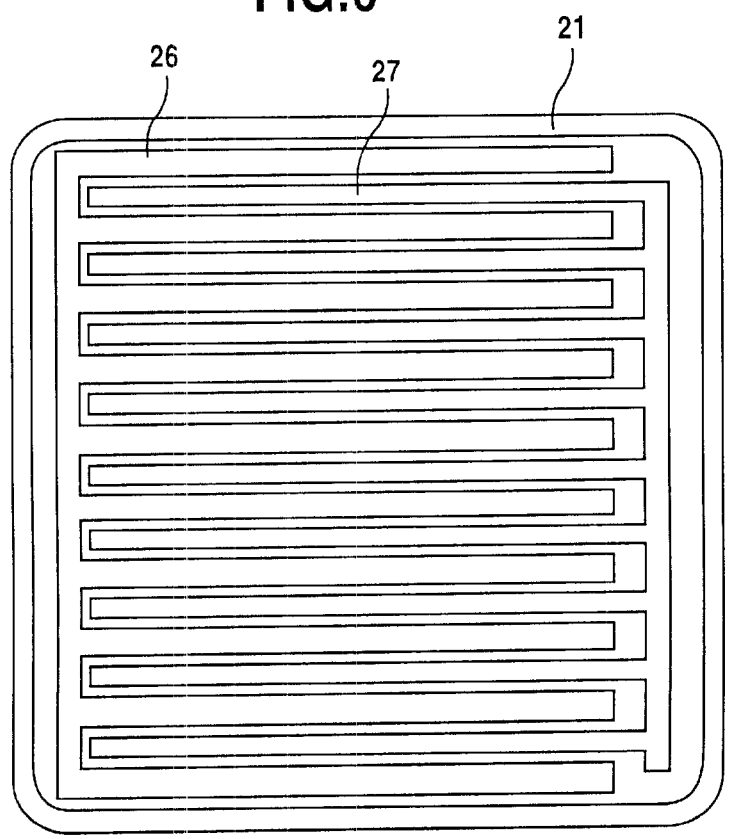
FIG. 6 is a view showing a pattern example when the electrodes of FIGS. 3 through 5 are formed.

In the examples shown in the above-mentioned FIGS. 3 through 5, the illustration has been made only to the formation of the base electrode connecting portions 24, while for example, as shown in FIG. 6, the base electrode 26 provided so as to be connected to the base electrode connecting portions 24, and the emitter electrode 27 provided so as to be connected to the emitter regions 23 may be formed in a comb-tooth type electrodes in which they are meshed with each other. By the fact that they are formed in a comb-tooth form in which they are meshed with each other, a current signal can be transmitted to respective emitter regions and base region without resistance loss.

As shown in the above-mentioned FIGS. 3 through 5, employing stripe structure or multi-base structure or the like allows the contact area of the emitter region with the base region to be made large, and thus, a much larger current to be accommodated. However, the collector current of the transistor is the current obtained by amplifying the base current, so that the larger the base current of respective cell (for example, each of the exposed portions 22E of the multi-base structure shown in FIG. 4), the larger the collector current can be made.

However, as described above, when formed in a base region is a base electrode connecting portion 24 with a conductivity type different from that of the base region, the base current flows through the p/n junction in the reverse direction, so that the base current flows through a small-area junction portion. Therefore, trying to make the base current larger causes the junction portion to be broken, so that the chip area must be made large to obtain further larger current.

Figure 7:
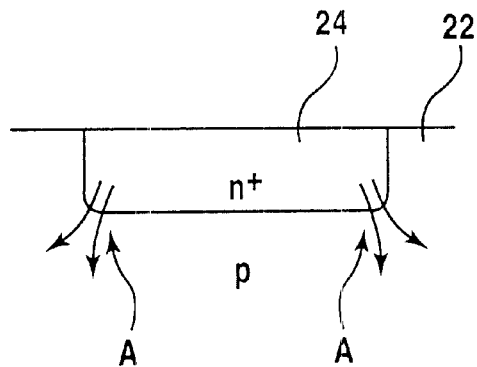
FIG. 7 is a view for explaining a state in which the current concentrate on the corner portion when the current flows from the base electrode connecting portion to the base region.

In order to solve such problem, as a result of concentrated efforts on the studies, the present inventor has found that the breakage at the junction portion of the base electrode connecting portion 24 with the base region 22 occurs due to the fact that currents are concentrated in the corner portion A of the junction as shown in FIG. 7. Also, the present inventor has found that a large current transistor in which currents are not locally concentrated and spread in the whole junction portion, and consequently base current is made large can be obtained by forming the base electrode connecting portion 24 to provide a bowl shape as the whole, or a semi-circular shape in section so that such local corner portion A is not formed.

Figure 8A:
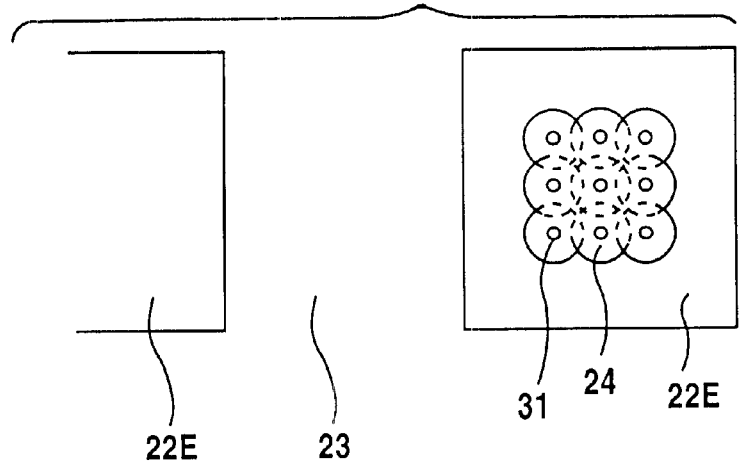
FIGS. 8(a) and 8(b) are views for explaining a structure of a base electrode connecting portion according to the present invention.
Figure 8B:
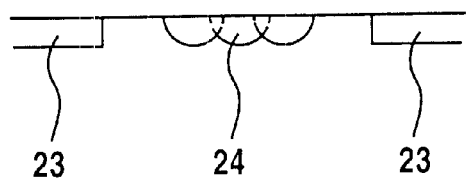

For example, as shown in FIGS. 8(a) and 8(b) wherein the plan explanatory view and sectional explanatory view of one base electrode connecting portion in FIG. 4 are illustrated, if several circular openings 31 with, for example, about 1–3 $\mu$m diameter are formed, and the portions 24 are formed by being diffused from the openings 31, at the interface portion of the p/n junction, the partial corner portion is not locally formed, and the structure is obtained in which spherical or bowl-shaped several p/n junctions are continuously formed as a whole. Thereby the partial concentration of current is avoided. As a result, even small p/n junction area allows a sufficiently large base current to be obtained, and in connection with it, a large current transistor with a large collector current is obtained.

Figure 9A:
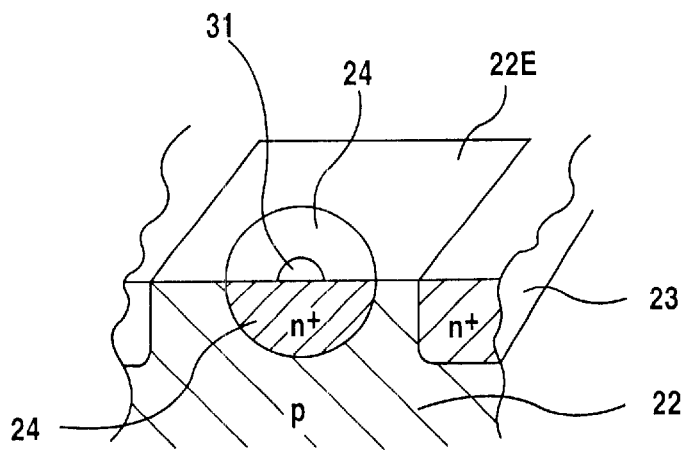
FIGS. 9(a) through 9(c) are views showing another example of a base electrode connecting portion according to the present invention.

In the examples shown in FIGS. 8(a) and 8(b), as a result that the openings 31 are formed vertically and holizontally respective three openings with the diameter about 0.5–2 $\mu$m, the distance (center distance of the opening 31) about 2.5 $\mu$m, and the diffusion depth about 1.5 $\mu$m, the size of the base electrode connecting portion 24 is about 8 μm×8 μm (the base region 22E is about 12 μm×12 μm), and the p/n junction is formed in a bowl shape. However, when the surface area of the base electrode connecting portion 24 is small, for example, as shown in FIG. 9(a), a base electrode connecting portion 24 with the diameter about 6 μm can be made by providing the diffusion of about 1.5 μm depth from one opening 31 with the diameter about 3 μm.

In this case, if the corner portion is formed in the opening 31, the corner portion is easy to be broken due to the current concentrated in that portion, so that the opening is preferably in nearly circular shape in which no corner portion is formed. When the diameter of the opening 31 is an excessively large with respect to the diffusion depth, the p/n junction after diffusion becomes plane at the portion equivalent to the opening, and the spherical surface is formed due to diffusion in the peripheral area, so that the area of the spherical portion becomes relatively small with respect to the area of the plane portion, whereby the problem with conventional current concentration occurs. Therefore, the diameter of the opening 31 is preferably equal to or less than about two times the diffusion depth. That is, if the base electrode connecting portion 24 is formed by diffusion from the opening with a shape which does not have a corner portion with a circular shape and the like having the diameter equal to or less than about two times the diffusion depth, the base current can be increased, and the collector current be increased.

Figure 9B:
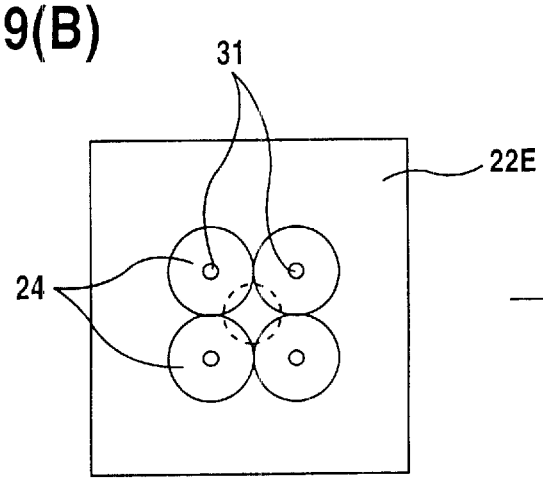

Although in the examples shown in FIGS. 8(a) and 8(b), the diffusion regions from respective openings 31 are diffused in a manner that the fair portions are overlapped, as shown in FIG. 9(b) wherein plan and sectional explanatory views are illustrated, the openings 31 can also be formed in a manner that the distance between the openings 31 is made widened to be connected by the surface so that the overlapped portion becomes as small as possible.

Figure 9C:
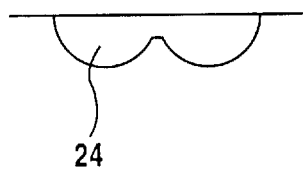
Figure 9D:
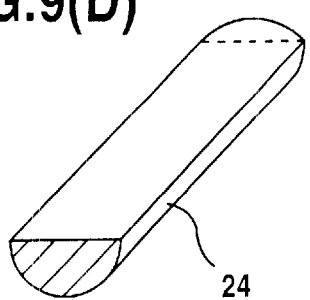
Figure 9E:
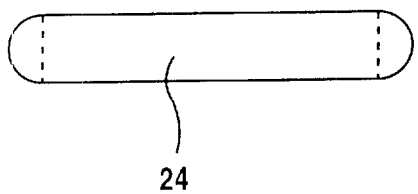

Further, as shown in FIG. 3, for the stripe emitter structure, the electrode connecting portion is formed also in a stripe shape, so that, as shown in FIG. 9(c) wherein the perspective explanatory view and plan explanatory view of the partial section of the base electrode connecting portion 24 is illustrated, the portion 24 may be formed in a circular arc in section and in a stripe shape. In this case, both ends, as shown in the plan explanatory view (right view) of the FIG. 9(c), are preferably formed in a circular arc so that local corner portions are not formed. Although in an example shown in FIG. 9(c), the portion 24 is formed in a one semicylindrical shape, the portion 24 may also be formed in a manner that two or more semicylindrical portions are overlapped.

Figure 10A:
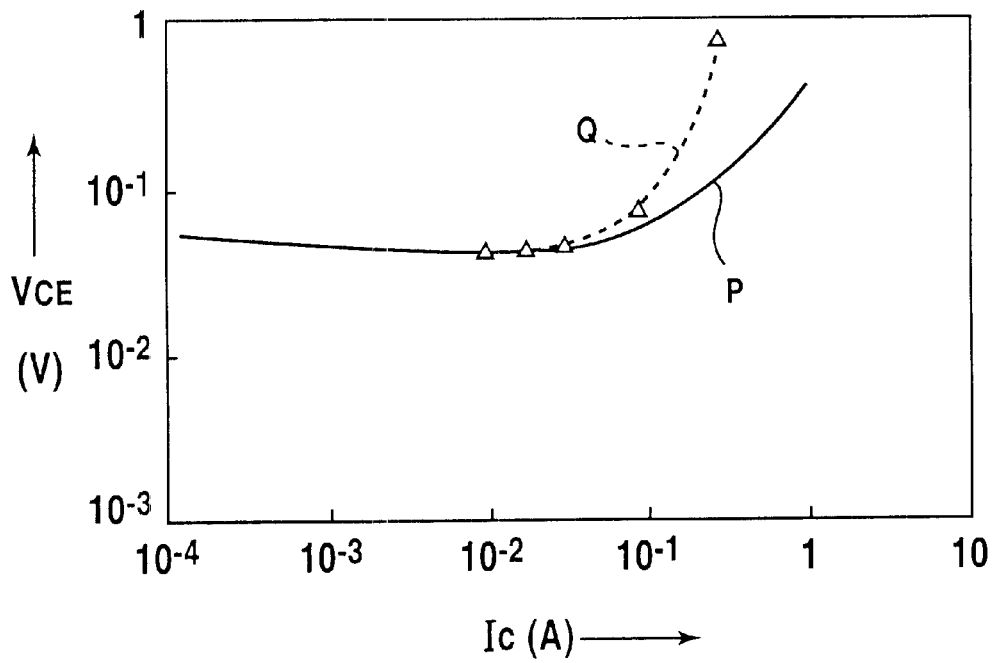
FIGS. 10(a) and 10(b) are views showing the transistor characteristics of structure shown in FIG. 9(a) compared with the structure shown in FIG. 4.
Figure 10B:
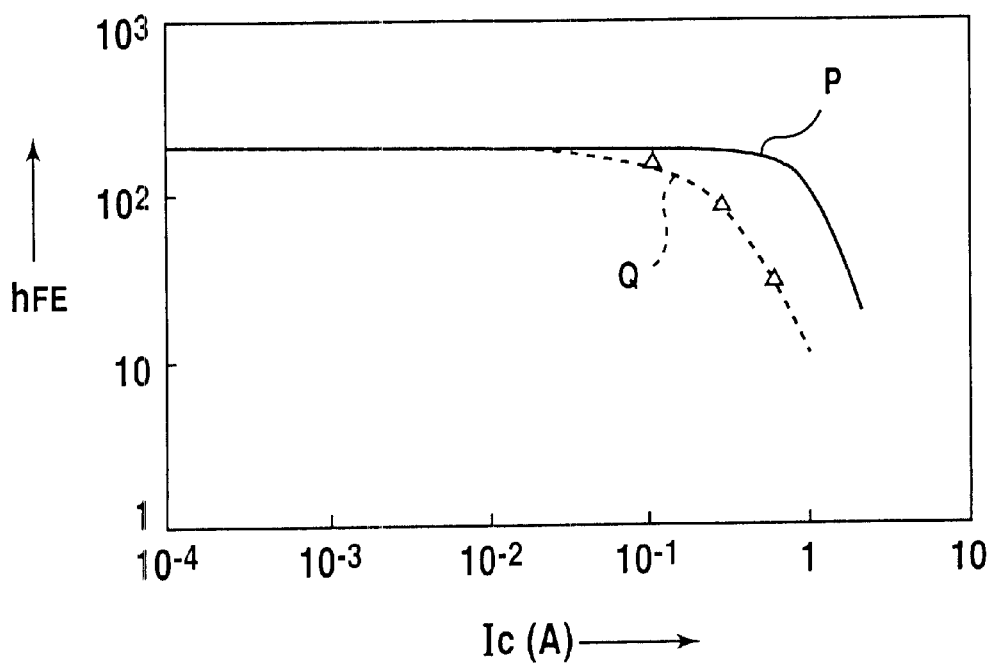

The relationship (P) of the saturated voltage $V_{CE(sat)}$ between collector/emitter of the structure shown in FIG. 9(a) with the collector current $I_C$ and the relationship (P) of the current amplification factor $h_{FE}$ with the collector current $I_C$ are shown in FIGS. 10(a) and 10(b), in comparison with the same relationship (Q) in the conventional square opening with a sectional area 6 μm×6 μm. As apparent from FIGS. 10(a) and 10(b), the conventional structure (Q) indicates that when the collector current becomes 0.1 A or more, the saturated voltage $V_{CE(sat)}$ between collector/emitter increases to cause the collector current to hardly flow, and that the current amplification factor $h_{FE}$ rapidly drops to cause the base current not to flow rapidly, while the present invention (P) indicates that both cases have been improved, respectively.

Figure 11A:
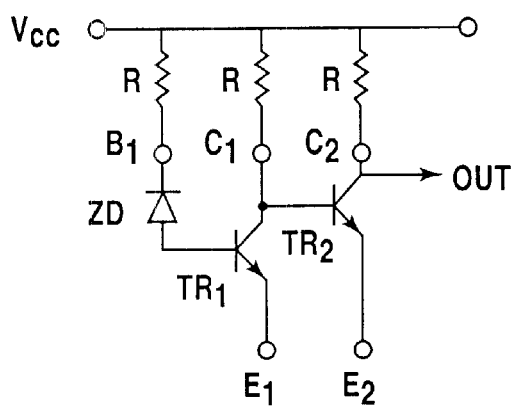
FIGS. 11(a) through 11(d) are explanatory views of an example configuring an overvoltage protective circuit by two elements in a single package using a transistor of the present invention.

FIGS. 11(a) through 11(d) are diagrams showing examples configuring an overvoltage protective circuit with two elements taken as one package by utilizing that the above-mentioned structure becomes the same as that with the Zener diode connected to the base of the transistor. That is, the structure becomes the one in which the Zener diode ZD is connected to the base of a first transistor TR1, as shown in FIG. 11(a), because the above-mentioned base electrode connecting portion functions as Zener diode, and. The overvoltage protective circuit can be formed by connecting the base of a second transistor TR2 to the collector C1, and connecting a base terminal B1 (the cathode terminal of Zener diode, hereinafter called the Zener base) and the collector terminal C1 of the first transistor TR1, and the collector terminal C2 of the second transistor through the resistance R, respectively, to the power line $V_{CC}$, as shown in FIG. 11(a).

Explaining the operation of the circuit, when a voltage lower than the breakdown voltage of the Zener diode ZD is inputted in the power line $V_{CC}$, the base current does not flow, so that the first transistor TR1 is not turned on, and the voltage is applied to the base of the second transistor TR2, whereby the second transistor TR2 operates and the power line voltage is outputted to the output terminal OUT. On the other hand, when a large voltage such as surge is applied to the power line $V_{CC}$, the first transistor TR1 is turned on, the second transistor TR2 is turned off, and the power line voltage is not outputted to the output terminal OUT. As a result, the circuit connected to the output side is protected from the overvoltage.

Figure 11B:
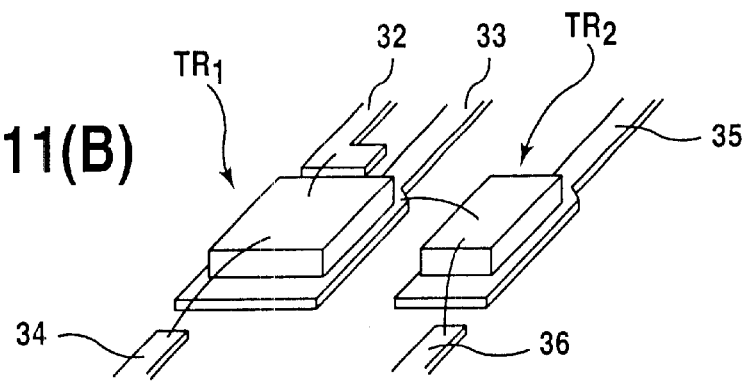
Figure 11C:
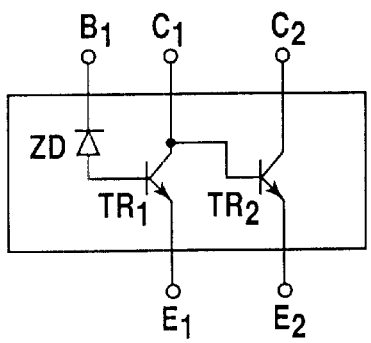
Figure 11D:
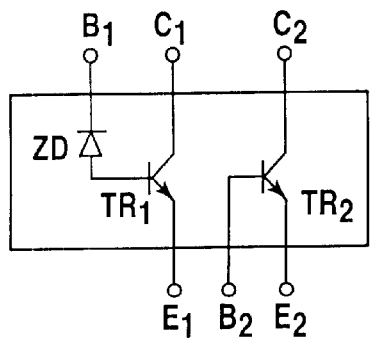

This circuit is formed of two transistors, that is the first transistor TR1 and the second transistor TR2, so that the overvoltage protective circuit can be formed in one package by using a lead frame normally used as two discrete elements, as shown in FIG. 11(b). In FIG. 11(b), numeral 32 designates a Zener base lead (B1) of the first transistor TR1; 33, a collector lead (C1); 34, an emitter lead (E1); 35, a collector lead (C2) of the second transistor TR2; and 36, an emitter lead (E2). Although when drawing them in a circuit diagram, they are shown in FIG. 11(c), respective elements may be enclosed in one package without being connected, and the base B2 of the second transistor TR2 be externally provided as shown in FIG. 11(d).

Figure 12A:
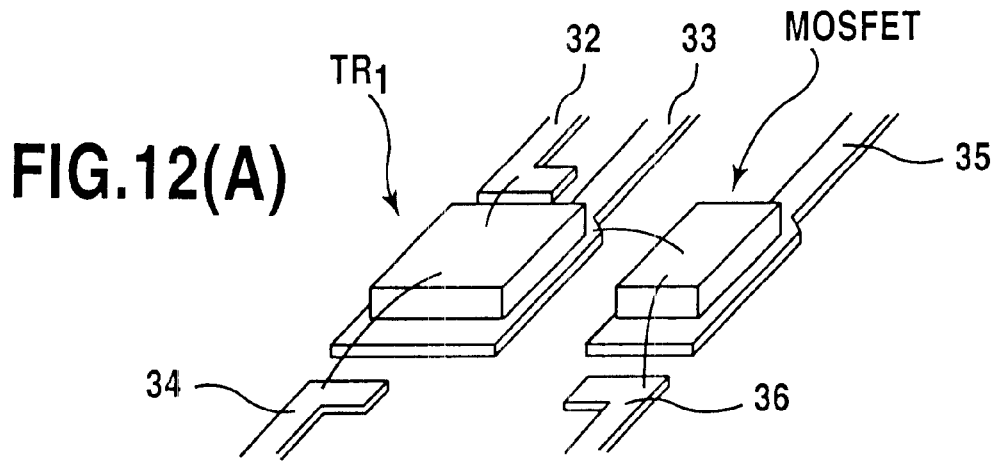
FIGS. 12(a) through 12(c) are views showing another embodiment of an overvoltage protective circuit according to the present invention.
Figure 12B:
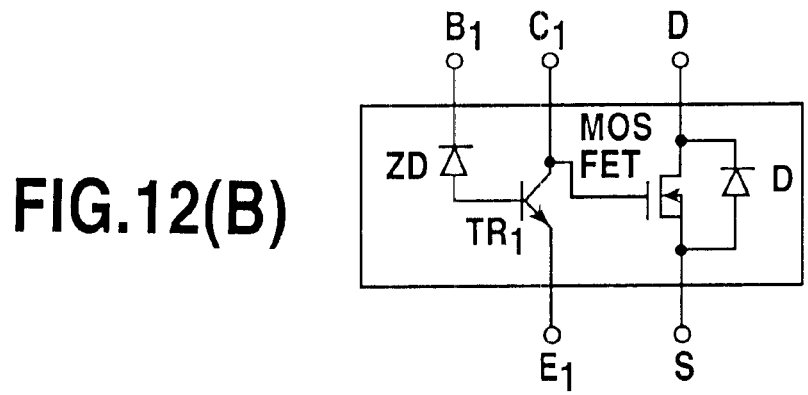
Figure 12C:
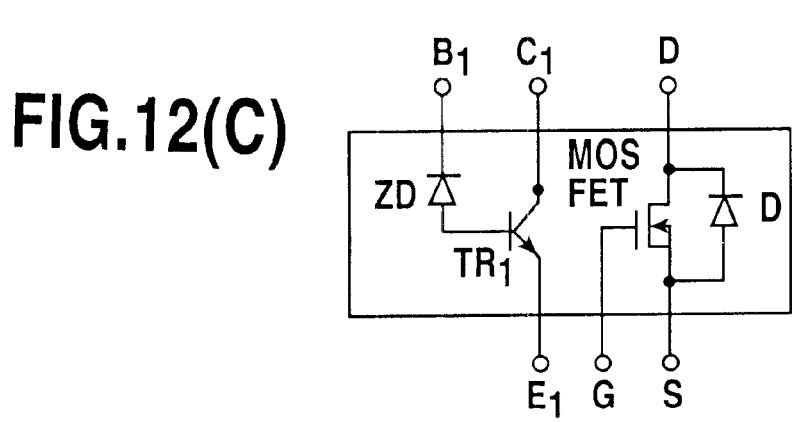
Figure 13:
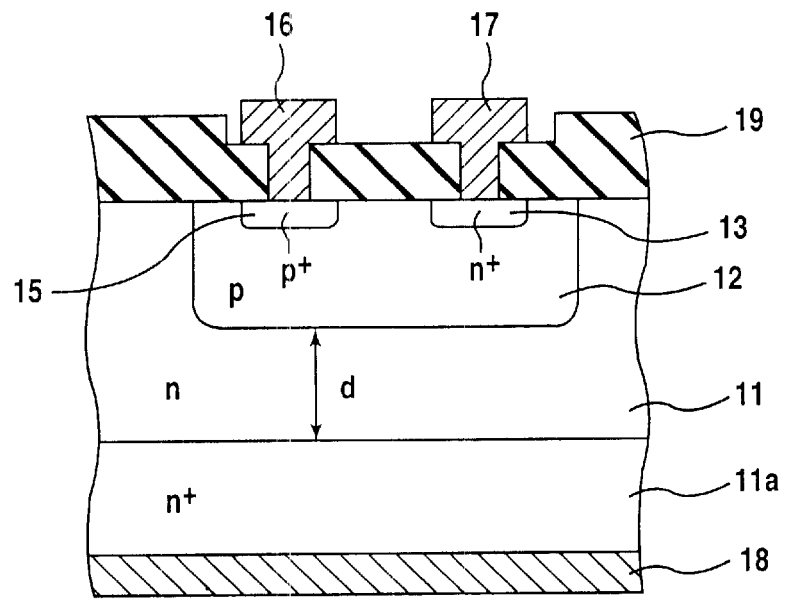
FIG. 13 is a sectional explanatory view showing a structure example of a conventional bipolar transistor.

FIGS. 12(a) through 12(c) show a similar overvoltage protective circuit which is configured in a manner that an MOSFET instead of the second transistor is connected at a gate G to the collector of the first transistor and which is enclosed in a package for two discrete elements as with the above-mentioned case. The other configuration and the operation are similar to example shown in FIG. 11, so that the explanation will be omitted. The equivalent circuit diagram in this case is shown in FIG. 12(b), wherein a drain terminal D and a source terminal S of the MOSFET are derived by leads 35, 36. Also, in this case, as shown in FIG. 12(c), the circuit may also be made a structure in which the gate G is provided externally, and connected outside the package.

Although each example mentioned above is an n/p/n transistor structure, it is needless to say that a p/n/p transistor is similar to the above. In this case, the Zener diode contained in the transistor exhibits a direction reverse to the above. Although in each diagram, the semiconductor substrate 21a is drawn thinly, it is needless to say that in fact, the thickness is about ten times or more than the semiconductor layer 21. Further, the relationship of the lead pin of the lead frame with the electrode of the transistor is also not to limited to the above-mentioned examples.

According to the present invention, power consumption can be made small with a high withstand voltage while making fast the switching speed of the bipolar transistor. Further, employing the structure of the present invention allows a voltage-drive type bipolar transistor such as a high-speed digital transistor with a small chip and without existing of a capacity and the like to be embodied.

Further, by employing the stripe emitter structure, the multi-base structure, or the multi-emitter structure, the joining area of the emitter region with the base region is increased to allow a large current to be achieved and further, a much larger current is obtained by diffusing the base electrode connecting portion from the opening with the size two times or less than the diffusion depth so as not to form corner portions, so that the base electrode connecting portion is formed in a manner that the joining portion exhibits a bowl shape and the section exhibits a circular arc.

Further, since the above-mentioned base electrode connecting portion functions as a Zener diode, a transistor having the same function as that of connecting the Zener diode to the base can be formed with one chip, and further, connecting the bipolar transistor or the MOSFET allows an overvoltage protective circuit with two elements to be formed. As a result, without requiring three elements to be contained, an overvoltage protective device for a large power not obtained by LSI and the like can be obtained with one package by using a package for two elements used for conventional discrete.

Although preferred examples have been described in some detail it is to be understood that certain changes can be made by those skilled in the art without departing from the spirit and scope of the invention as defined by the appended claims.

What is claimed is:

1. A transistor comprising:
   a first conductivity tape semiconductor layer taken as a collector region;
   a base region consisting of a second conductivity type region provided in said first conductivity type semiconductor layer;
   an emitter region consisting of a first conductivity type region provided in said base region;
   a base electrode connecting portion having a first conductivity type provided in said base region;
   a base electrode provided on the surface of said base electrode connecting portion; and
   an emitter electrode and a collector electrode provided and electrically connected to said emitter region and said collector region, respectively,
   wherein Zener diode is formed so as to be broken down at a desired voltage at the p/n junction between said base electrode connecting portion and said base rejoin, by adjusting the impurity concentration of said base electrode connecting portion, said Zener diode being incorporated in series with the base.

2. The transistor of claim 1, wherein said emitter region has a plurality of stripe shape regions, and said base electrode connecting portion is formed along said stripe shape regions in said base region between said plurality of stripe shape regions.

3. The transistor of claim 1, wherein said base region is formed so as to be exposed in a matrix form in said emitter region, and said base electrode connecting portion is formed in each of said base region exposed in a matrix form.

4. The transistor of claim 1, wherein said emitter region has a plurality of regions which are formed so a to be exposed in a matrix form in a said base region, and said base electrode connecting portion is formed in said base region adjacent to each of said plurality of regions.

5. The transistor of claim 2, 3 or 4, wherein said emitter electrode connected to said emitter region and said base electrode connected to said base electrode connecting portion are formed in an alternately meshed comb-tooth form.

6. The transistor of claim 1, wherein said base electrode connecting portion is formed by the diffusion from a circular opening having a diameter two times or less than the diffusion depth, or from an elongated opening having a width two times or less than the diffusion depth and having circular arc ends taking said width as a diameter.

7. An overvoltage protective device comprising:
   a first transistor asset forth in claim 1; and
   a second transistor connected at the base to the collector or emitter of said first transistor,
   wherein said first and second transistors are contained in one package.

8. An overvoltage protective device comprising:
   a transistor as set forth in claim 1; and
   a MOS transistor connected at the gate to the collector or emitter of said transistor,
   wherein said transistor and said MOS transistor are contained in one package.

* * * * *